United States Patent

Nishiuchi

[11] Patent Number: 6,072,338
[45] Date of Patent: Jun. 6, 2000

[54] METHOD OF AND DEVICE FOR DETERMINING PULSE WIDTH

[75] Inventor: Taiki Nishiuchi, Tokyo, Japan

[73] Assignees: Mitsubishi Electric Engineering Company Limited; Mitsubishi Denki Kabushiki Kaisha, both of Tokyo, Japan

[21] Appl. No.: 09/095,798

[22] Filed: Jun. 11, 1998

[30] Foreign Application Priority Data

Mar. 30, 1998 [JP] Japan .................................. 10-084399

[51] Int. Cl.[7] ...................................................... G06M 3/00
[52] U.S. Cl. .................................. 327/31; 377/20; 377/52
[58] Field of Search ........................... 377/20, 52; 327/31

[56] References Cited

U.S. PATENT DOCUMENTS

| | | | |
|---|---|---|---|
| 4,039,936 | 8/1977 | Jones et al. | 324/34 D |
| 4,864,434 | 9/1989 | Janz | 360/55 |
| 4,982,109 | 1/1991 | Burwell | 327/31 |
| 5,239,474 | 8/1993 | Eaton, Jr. et al. | 364/449 |
| 5,351,028 | 9/1994 | Krahn | 338/32 R |
| 5,394,070 | 2/1995 | Jacobsen et al. | 318/568 |
| 5,438,328 | 8/1995 | Kweon | 327/31 |
| 5,545,985 | 8/1996 | Campbell | 324/207.21 |
| 5,589,769 | 12/1996 | Krahn | 324/207.26 |
| 5,598,116 | 1/1997 | Kwon | 327/31 |
| 5,631,592 | 5/1997 | Schwarz et al. | 327/24 |

FOREIGN PATENT DOCUMENTS 7-159463  6/1995  Japan .

Primary Examiner—Margaret R. Wambach
Attorney, Agent, or Firm—Burns, Doane, Swecker & Mathis, LLP

[57] ABSTRACT

A pulse width determining device includes a down counter for counting down from a first initial count value reloaded thereinto. If the down counter underflows, it can start counting down from a second initial count value reloaded thereinto as needed. Every time the device receives an input pulse, a count clock control circuit can set a period of time during which it can generate and furnish count clock pulses to the down counter, according to the pulse width of the input pulse. The device can determine whether or not the pulse width of the input pulse is in a predetermined range of pulse widths according to a relation between timing with which the down counter underflows and the time period during which the count clock pulses are generated. To be more specific, after the down counter, which started at the first initial count value, has underflowed, the device determines that the pulse width of the pulse lies in the predetermined range if the time period set by the count clock control circuit is finished before the down counter, which started counting down from the second initial count value, underflows.

15 Claims, 14 Drawing Sheets

METHOD OF AND DEVICE FOR DETERMINING PULSE WIDTH

BACKGROUND OF THE INVENTION

1. Field of the Invention

The present invention relates to a method of determining whether or not the pulse duration or width of a pulse is in a predetermined range, and a pulse width determining device using the method.

2. Description of the Prior Art

In serial communications or the like, whether a pulse received complies with a protocol can be determined by measuring the pulse width of the pulse by means of an up counter while performing the receiving operation on the pulse. Referring next to FIG. 13, there is illustrated a block diagram showing the structure of a prior art pulse width determining device for determining whether or not the pulse duration of a pulse is in a predetermined range by means of an up counter. In the figure, reference numeral 131 denotes an edge detecting circuit for detecting the rising and falling edges of each asynchronous pulse applied thereto and for furnishing pulses EDG, EDG1, and EDG2 synchronous to a timer clock signal TCK used for synchronization in the whole of the device, 132 denotes a transfer control circuit for generating a transfer control signal TRS for enabling a switch 135 to transfer the count value of an up counter 136, which is a result of measurement of the pulse width, from the pluses EDG and EDG1 from the edge detecting circuit 131 after the pulse width measurement, and for furnishing the transfer control signal TRS to the switch 135, 133 denotes a counter clear control circuit for generating a clear signal CLR for resetting the count value of the up counter 136 to "00" from the pulses EDG1 and EDG2 from the edge detecting circuit 131 in preparation for the next measurement after the completion of the current pulse width measurement, and for furnishing the clear signal CLR to the up counter 136, and 134 denotes a register for storing the current count value of the up counter 136. The switch 135 can connect the up counter 136 with the register 134, or disconnect the up counter 136 from the register 134, according to the value of the transfer control signal TRS. The up counter 136 can furnish an overflow signal OVF indicating that it is impossible to determine the pulse width of each pulse applied the edge detecting circuit. Reference numeral 137 denotes an INTOVF output circuit which can furnish an interrupt signal INTOVF when the up counter 136 furnishes the overflow signal OVF to the INTOVF output circuit, 138 denotes an INTEDG output circuit for generating an interrupt signal INTEDG indicating the completion of the pulse width measurement from the pulses EDG and EDG2, and RST denotes a reset signal.

In operation, when the power to the pulse width determining device is turned on, the reset signal RST makes a LOW to HIGH transition and the device is then reset. The up counter 136 starts counting up the number of pulses of the timer clock TCK applied thereto. Other components within the device start to run in synchronization with the timer clock TCK.

Referring next to FIG. 14, there is illustrated a timing chart showing the waveforms of signals from components of the pulse width determining device. Hereafter, a description will be made as to the operation of the device with reference to the timing chart of FIG. 14. When the edge detecting circuit 131 receives a pulse, which is applied to the pulse width determining device, asynchronous to the timer clock TCK, it, from the pulse, generates a pulse EDG synchronous to the timer clock TCK, another pulse EDG1 delayed by one-half of the pulse repetition period of the timer clock with respect to the pulse EDG, and another pulse EDG2 delayed by the pulse repetition period of the timer clock with respect to the pulse EDG. The transfer control circuit 132 then receives the pluses EDG and EDG1 and generates and furnishes a transfer control signal TRS which is at a HIGH level to the switch 135 only when only any one of the pulses EDG and EDG1 is at a HIGH level. The switch 135 is turned on only when the transfer control signal makes a LOW to HIGH transition, and it is held in its on state while the transfer control signal TRS is at a HIGH level. When the switch 135 is turned on, the count value of the up counter 136 is transferred to and is then stored in the register 134. Simultaneously, when the INTEDG output circuit 138 receives the pulses EDG and EDG2 from the edge detecting circuit, it furnishes an interrupt signal INTEDG which is at a LOW level only when only any one of the pulses EDG and EDG2 is at a HIGH level.

On the other hand, when the counter clear control circuit 133 receives the pulses EDG1 and EDG2 from the edge detecting circuit, it furnishes a clear signal CLR which is at a HIGH level to the up counter 136 only when only any one of the pulses EDG1 and EDG2 is at a HIGH level. The clear signal CLR is delayed by one-half of the pulse repetition period of the timer clock TCK with respect to the transfer control signal TRS, as shown in FIG. 14. In response to the clear signal CLR, the up counter 136 resets itself and then starts counting up the number of pulses applied thereto from the count value "0" again.

In this manner, the up counter 136 counts up the number of pulses of the timer clock TCK applied thereto within a period of time during which the pulse EDG is held at a HIGH level, and stores the count value into the register 134 by way of the switch 135 when the pulse EDG makes a HIGH to LOW transition. As a result, either a system employing the pulse width determining device or the user can determine whether the received pulse signal has a pulse width which complies with a serial communications protocol by comparing the count value, stored in the register 134, representing the pulse width of the input pulse with the given pulse width defined by the serial communications protocol.

When the conventional pulse width determining device receives a pulse having a pulse width which is too unusually large for the device to measure it, the up counter 136 overflows and then furnishes an overflow signal OVF asserted LOW to the INTOVF output circuit 137. The INTOVF output circuit 137 generates and furnishes an interrupt signal INTOVF which makes a HIGH to LOW transition in synchronization with the falling edge of the overflow signal OVF, and, after that, makes a LOW to HIGH transition after the pulse repetition period of the timer clock signal TCK. A system employing the pulse width determining device or the user can realize that it is impossible to measure the pulse width of the received pulse from the interrupt signal INTOVF. This further makes it possible for the system or the user to implement action to, for example, stop the pulse width determining process for pulses which will be applied to the device.

Thus the prior art pulse width determining device which is so constructed as mentioned can determine whether a received signal complies with a protocol by determining the pulse width of the received signal. However, determining whether the received signal has a pulse width defined by the protocol rather than the pulse width of the received signal is of importance with serial communications. In other words, since INTOVF indicates that it is impossible to measure the pulse width of the received pulse and INTEDG indicates the completion of the pulse width measurement, it can be said that the prior art pulse width only performs a serial communications receiving operation on the received pulse so as to furnish such the indirect signals INTOVF and INTEDG.

While a protocol defining the processing time period for anomalous communication conditions has been being determined so as to handle communication anomalies in a short time, a problem with the prior art pulse width determining device mentioned above is that since the up counter can count up to it maximum count value which is much greater than a predetermined count value corresponding to a maximum pulse width defined by a communications protocol, when the prior art device receives a pulse having a pulse width greater than the maximum pulse width, it causes the up counter to continue to count up without furnishing the interrupt signal INTOVF that it is impossible to measure the pulse width until it determines the pulse width and finally it cannot determine the pulse width within the processing time period defined by the protocol, and therefore the prior art pulse determining device cannot keep up with speeding up communications.

Japanese Patent Application Laying Open (KOKAI) NO. 7-159463 discloses a pulse width determining circuit including a plurality of counters for speeding up the process of determining the duty cycle of a pulse, in which the arithmetic computations for the pulse width determining process are simplified. A problem with the prior art pulse determining circuit is that when it receives a pulse having an extraordinarily long pulse repetition period, it cannot perform the pulse width determining process at a high speed, like the aforementioned prior art pulse width determining device as shown in FIG. 13, because it obtains a reference computation data for the determination of the duty cycle by measuring one repetition period of a pulse the pulse width of which is to be determined.

SUMMARY OF THE INVENTION

The present invention is made to overcome the above problems. It is therefore an object of the present invention to provide a method of and a device for speedily determining whether or not the pulse width of an input pulse is in a predetermined range of pulse widths without measuring the pulse width of the input pulse.

In accordance with one aspect of the present invention, there is provided a pulse width determining device for determining the pulse width of a pulse applied thereto, comprising: a unit for storing at least an initial count value corresponding to a predetermined pulse width; a down counter unit for counting down from the initial count value stored in the storing unit until it underflows; a control unit for setting a period of time during which the down counter unit can count down according to the pulse width of a pulse applied to the device; and a unit for determining whether or not the pulse width of the pulse is less than the predetermined pulse width according to a relation between timing with which the down counter unit underflows and the time period set by the control unit.

The initial count value can correspond to the shortest one in a predetermined range of pulse widths. Alternatively, the initial count value corresponds to the longest one in a predetermined range of pulse widths.

Preferably, in addition to the first initial count value corresponding to the shortest one in the predetermined range of pulse widths, the storing unit stores a second initial count value corresponding to either the longest one in the predetermined range of pulse widths or a difference between the longest pulse width and the shortest pulse width. In this case, the determining unit determines that the pulse width of the pulse is less than the shortest pulse width if the time period set by the control unit is finished before the down counter unit, which started counting down from the first initial count value, underflows, determines that the pulse width of the pulse lies in the predetermined range from the shortest pulse width to the largest pulse width if the down counter unit, which started counting down from the first initial count value, has underflowed and the time period set by the control unit is finished before the down counter unit, which started counting down from the second initial count value, underflows again, and determines that the pulse width of the pulse is greater than the largest pulse width if the down counter unit, which started counting down from the first and second initial count values sequentially or simultaneously, has underflowed twice before the time period set by the control unit is finished.

In accordance with another aspect of the present invention, there is provided a pulse width determining device for determining the pulse width of a pulse applied thereto, comprising: a unit for storing first and second initial count values; a down counter unit for counting down from the first initial count value stored in the storing unit until it underflows, and for starting counting down from the second initial count value stored in the storing unit after the underflow occurs or at the same time when starting counting down from the first initial count value until the down counter unit underflows again; a control units for setting a period of time during which the down counter unit can count down according to the pulse width of a pulse applied to the device; and a unit for determining whether the pulse width of the pulse lies in a predetermined range from a first predetermined pulse width to a second predetermined pulse width according to a relation between timing with which the down counter unit underflows and the time period set by the control unit.

Preferably, the determining unit determines that the pulse width of the pulse lies in the predetermined range if the down counter unit, which started counting down from the first initial count value, has underflowed and the time period set by the control unit is finished before the down counter unit, which started counting down from the second initial count value, underflows again. As an alternative, the determining unit can determine that the pulse width of the pulse is less than the first predetermined pulse width if the time period set by the control unit is finished before the down counter unit, which started counting down from the first initial count value, underflows, and determine that the pulse width of the pulse is greater than the second predetermined pulse width if the down counter unit, which started counting down from the first and second initial count values sequentially or simultaneously, has underflowed twice before the time period set by the control unit is finished.

In a preferred embodiment of the present invention, the down counter unit is a single down counter and the device further comprises an initial value setting unit for setting the first initial value into the down counter first, and for setting the second initial value into the down counter after the down counter, which started counting down from the first initial count value, underflows, as needed. Furthermore, the first initial value corresponds to the first predetermined pulse width and the second initial value corresponds to a difference between the first and second predetermined pulse widths.

Preferably, the storing unit includes a first reload register for storing the first initial count value, and a second reload register for storing the second initial count value. The initial value setting unit can include a switch for connecting the first reload register with the down counter first and for connecting the second reload register with the down counter after the down counter, which started counting down from the first initial count value, underflows.

In accordance with another aspect of the present invention, there is provided a method of determining the pulse width of a pulse applied thereto, comprising the steps of: storing at least one initial count value corresponding to a predetermined pulse width; generating count clock pulses within a period of time having a length corresponding to the pulse width of an input pulse; counting down the count clock pulses from the initial count value; determining whether or not the pulse width of the input pulse is less than the predetermined pulse width according to a relation between timing with which an underflow occurs and the time period during which the count clock pulses are generated.

The initial count value can correspond to the shortest one in a predetermined range of pulse widths. Alternatively, the initial count value can correspond to the longest one in a predetermined range of pulse widths.

Preferably, in addition to the first initial count value corresponding to the shortest one in the predetermined range of pulse widths, a second initial count value is stored, the second initial count value corresponding to either the longest one in the predetermined range of pulse widths or a difference between the longest pulse width and the shortest pulse width. In the down counting step, the count clock pulses are counted down from the first initial count value, and the count clock pulses are further or also counted down from the second initial count value after an underflow occurs starting from the first initial count value or at the same time when starting counting down from the first initial count. In the determining step, it is determined that the pulse width of the pulse is less than the shortest pulse width if the time period during which the count clock pulses are generated is finished before an underflow occurs, it is determined that the pulse width of the pulse lies in the predetermined range from the shortest pulse width to the largest pulse width if an underflow has occurred starting from the first initial count value in the down counting step and the time period is finished before a further underflow occurs in the down counting step, and it is determined that the pulse width of the pulse is greater than the largest pulse width if two successive underflows have occurred in the down counting step before the time period is finished.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
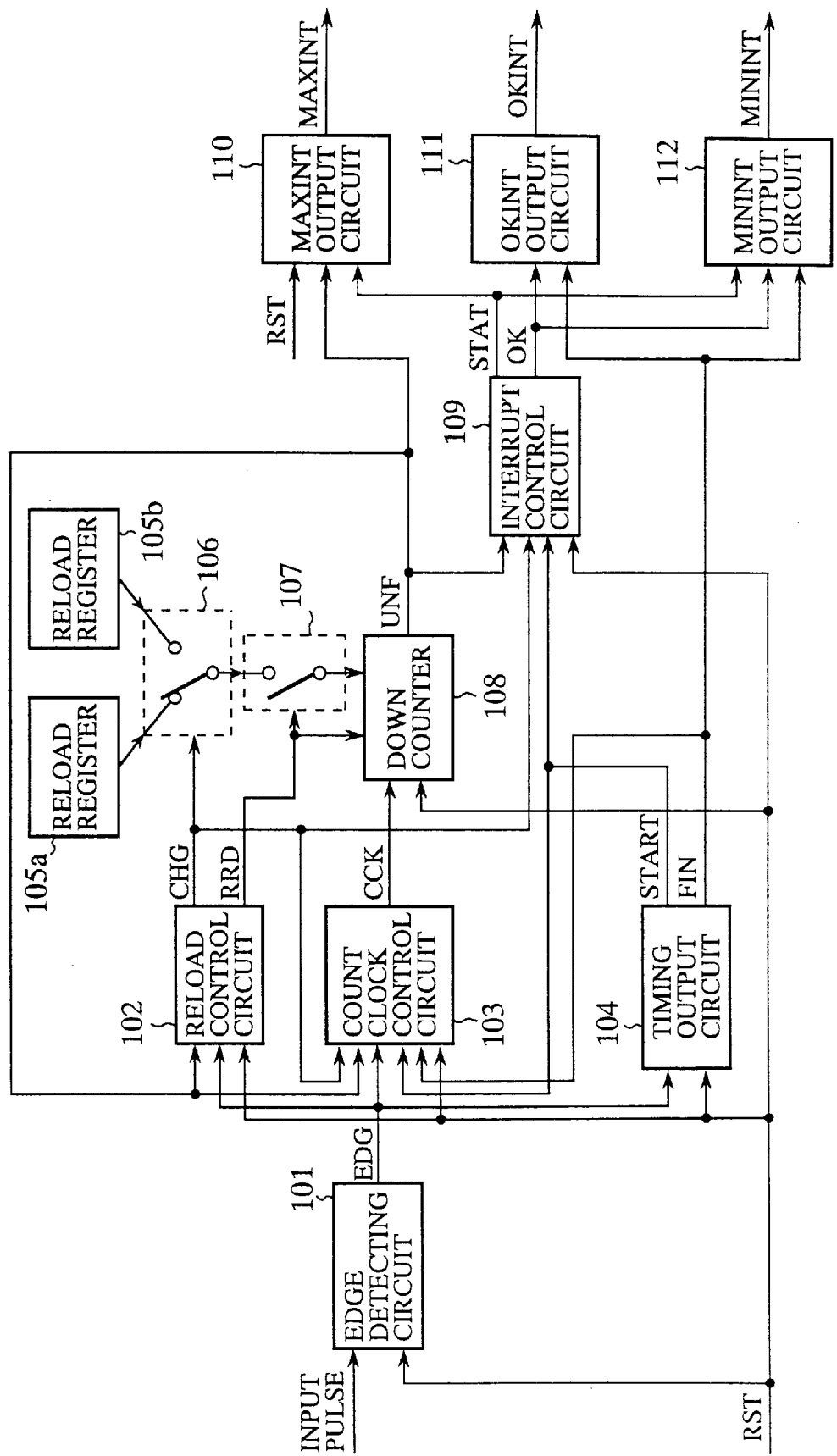
FIG. 1 is a block diagram showing the structure of a pulse width determining device according to an embodiment of the present invention.

Referring next to FIG. 1, there is illustrated a block diagram showing the structure of a pulse width determining device according to an embodiment of the present invention. In the figure, reference numeral 1 denotes an edge detecting circuit for detecting the rising and falling edges of an asynchronous pulse applied thereto, and for making the input pulse synchronous to a timer clock TCK used for synchronization of the whole of the pulse width determining device of the embodiment, and for furnishing the input pulse synchronous to the clock as a pulse EDG, 102 denotes a reload control circuit for generating a reload signal RRD for providing timing to reload an initial count value into a down counter, and a switching signal CHG for switching the target to which the down counter 108 is connected between a first reload register 105a and a second reload register 105b, 103 denotes a count clock control circuit for generating and furnishing a count clock CCK to the down counter 108 which counts down from an initial value every time it receives each pulse of the count clock CCK, and 104 denotes a timing output circuit for furnishing a timing signal START to trigger the down counter 108 to start counting down from an initial value, and a pulse end signal FIN showing the falling edge of the pulse EDG from the edge detecting circuit 101.

The first reload register 105a holds a first initial count value representing the number of clock pulses which corresponds to a minimum pulse width defined by a protocol governing serial communications. The second reload register 105b holds a second initial count value representing the number of clock pulses which corresponds to a difference between a maximum pulse width similarly defined by the protocol governing serial communications and the minimum pulse width. A switch 106 can switch the target to which the down counter 108 is connected between the first reload register 105a and the second reload register 105b. A switch 107 can connect the switch 106 coupled to either the first reload register 105a or the second reload register 105b with the down counter 108 in response to the reload signal RRD. As previously explained the down counter 108 counts down every time it receives each pulse of the count clock CCK from the count clock control circuit. When the down counter 108 reaches 0, it furnishes an underflow signal UNF indicating that it has underflowed. When the switching signal CHG is furnished at a LOW level, the switch 106 connects the first reload register 105a with the switch 107. Otherwise, the switch 106 connects the second reload register 105b with the switch 107.

Furthermore, reference numeral 109 denotes an interrupt control circuit for furnishing a timing signal STAT which makes a LOW to HIGH transition on the falling edge of the switching signal CHG, and a timing signal OK which makes a LOW to HIGH transition on the rising edge of the switching signal CHG and makes a HIGH to LOW transition when both the timing signal START and the underflow signal UNF are at a LOW level, 110 denotes a MAXINT output circuit for furnishing an interrupt signal MAXINT indicating that the down counter 108, which started at the second initial count value stored in the second reload register 105b, has underflowed and furnished an underflow signal UNF at a LOW level, 111 denotes an OKINT output circuit for furnishing an interrupt signal OKINT indicating that it has detected the falling edge of the pulse EDG while the down counter 108 is counting down from the second initial count value stored in the second reload register 105b after the down counter 108, which started at the first initial count value stored in the first reload register 105a, has underflowed and furnished an underflow signal UNF at a LOW level, 112 denotes a MININT output circuit for furnishing an interrupt signal MININT indicating that it has detected the falling edge of the pulse EDG while the down counter 108 is counting down from the first initial count value stored in the first reload register 105a, and RST denotes a reset signal.

Figure 2:
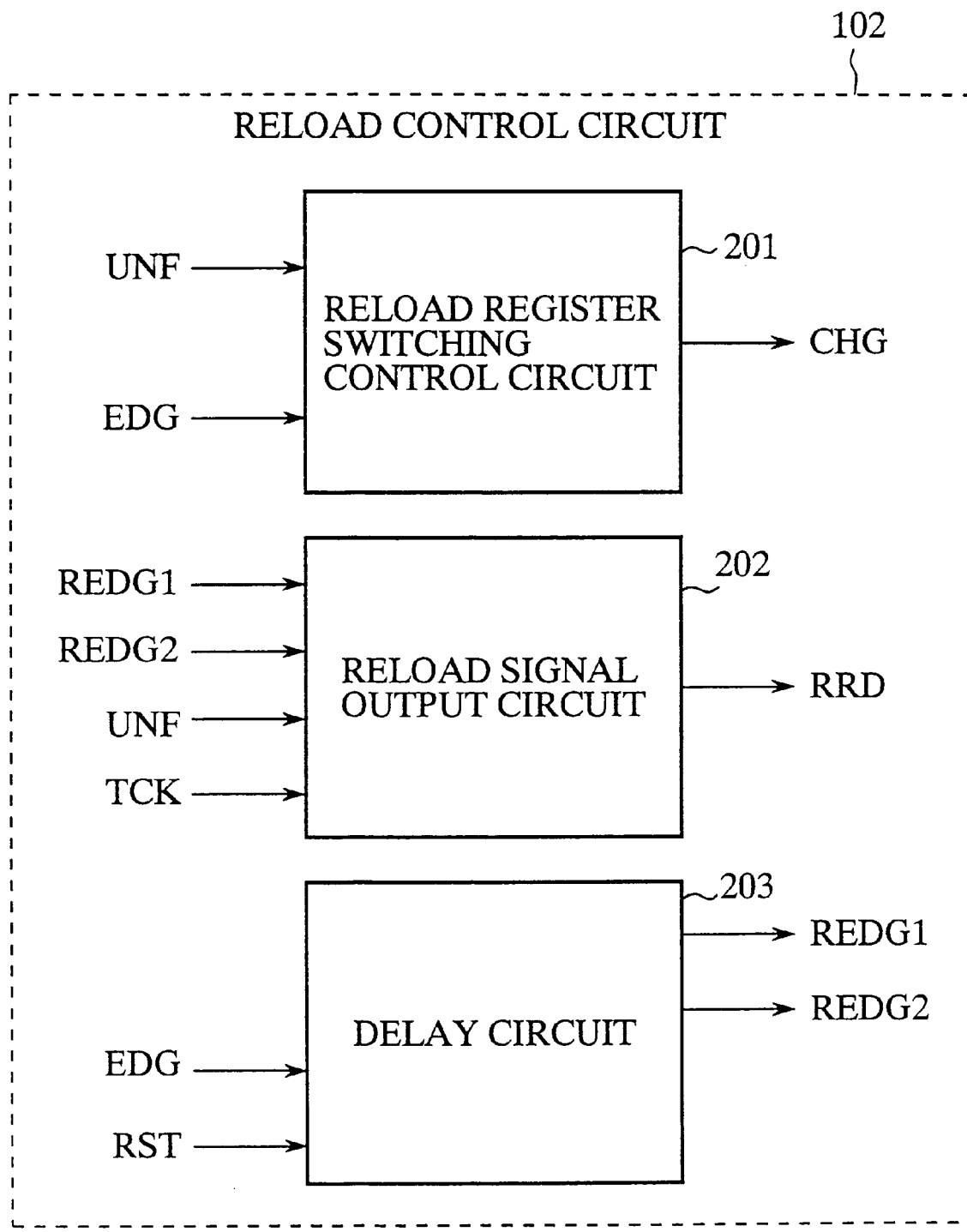
FIG. 2 is a block diagram showing the structure of a reload control circuit of the pulse width determining device according to the embodiment.

Referring next to FIG. 2, there is illustrated a block diagram showing the structure of the reload control circuit 102. In the figure, reference numeral 201 denotes a reload register switching control circuit for generating a switching signal CHG according to the underflow signal UNF and the pulse signal EDG applied thereto, 203 denotes a delay circuit for delaying the pulse EDG applied thereto by two difference specified time intervals so as to generate two delayed pulses REDG1 and REDG2, and 202 denotes a reload signal output circuit for generating a reload signal RRD according to the delayed pulses REDG1 and REDG2, the underflow signal UNF, and the timer clock TCK. The reload register switching control circuit causes the switching signal CHG to switch between its HIGH state and its LOW state every time it receives a falling edge of the underflow signal UNF. The switching signal CHG also makes a HIGH to LOW transition in synchronization with the falling edge of the pulse EDG.

Figure 3:
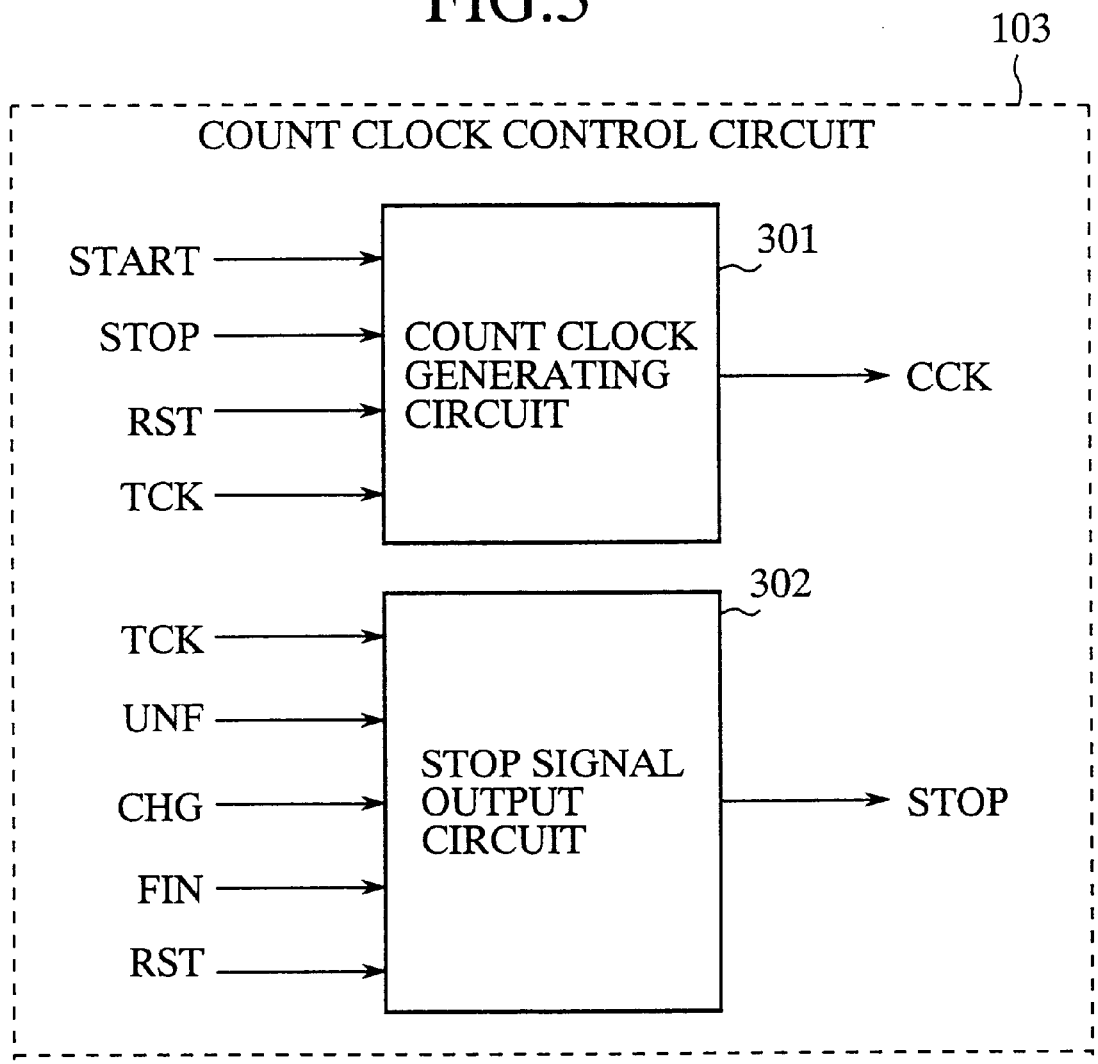
FIG. 3 is a block diagram showing the structure of a count clock control circuit of the pulse width determining device according to the embodiment.

Referring next to FIG. 3, there is illustrated a block diagram showing the structure of the count clock control circuit 103. In the figure, reference numeral 301 denotes a count clock generating circuit for generating a count clock CCK according to the timing signal START, a timing signal STOP, the reset signal RST, and the timer clock TCK applied thereto, and 302 denotes a STOP signal output circuit for generating a timing signal STOP for stopping the generation of the count clock CCK according to the timer clock TCK, the underflow signal UNF, the switching signal CHG, a pulse end signal FIN, and the reset signal RST applied thereto.

Figure 4:
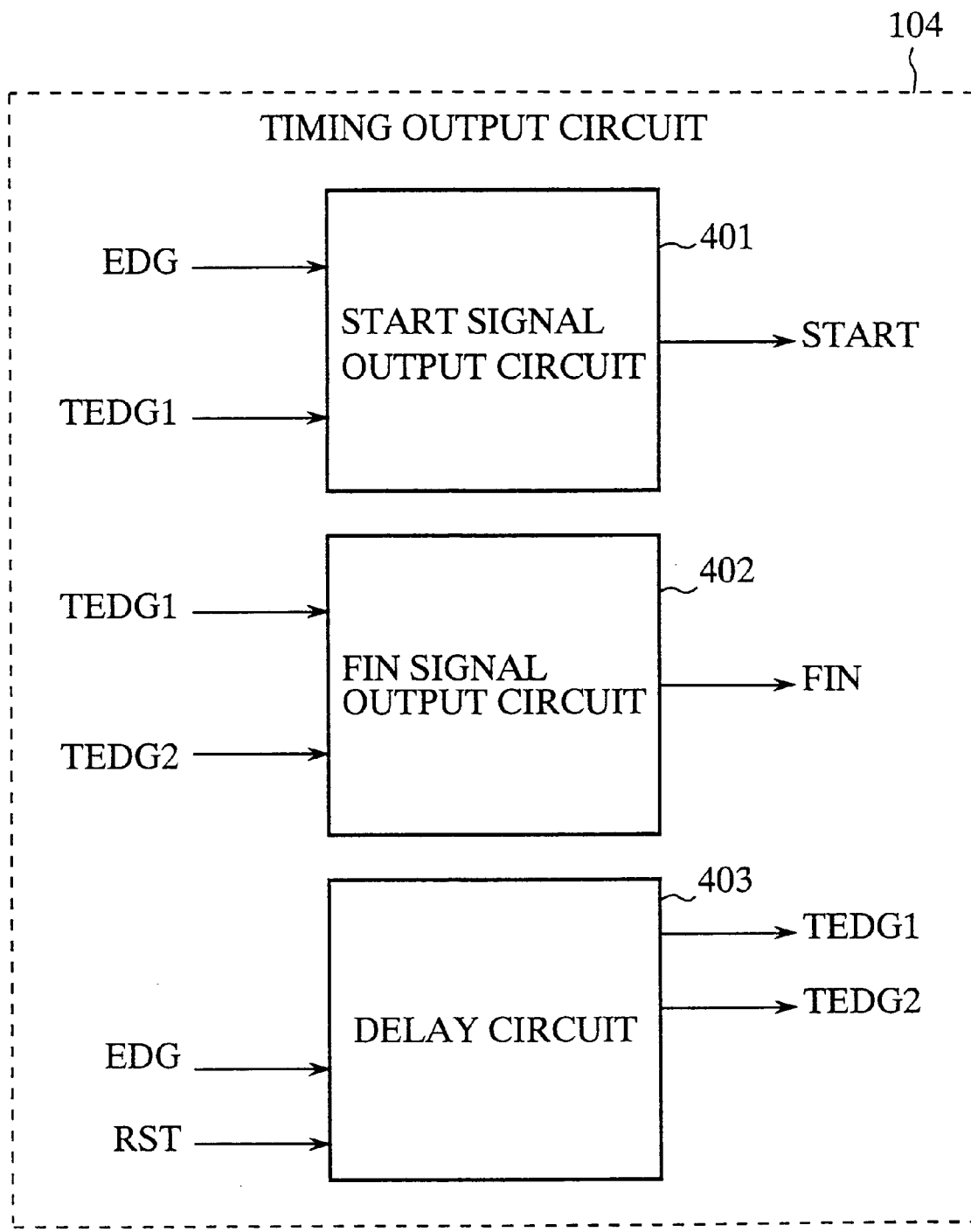
FIG. 4 is a block diagram showing the structure of a timing output circuit of the pulse width determining device according to the embodiment.

Referring next to FIG. 4, there is illustrated a block diagram showing the structure of the timing output circuit 104. In the figure, reference numeral 401 denotes a START signal output circuit for generating a timing signal START according to the pulse EDG and the delayed pulse TEDG1 applied thereto, 403 denotes a delay circuit for delaying the pulse EDG by two different specified time intervals according to the reset signal RST applied thereto so as to generate two delayed pulses TEDG1 and TEDG2, and 402 denotes a FIN signal output circuit for generating a pulse end signal FIN according to the delayed pulses TEDG1 and TEDG2 applied thereto.

Figure 5:
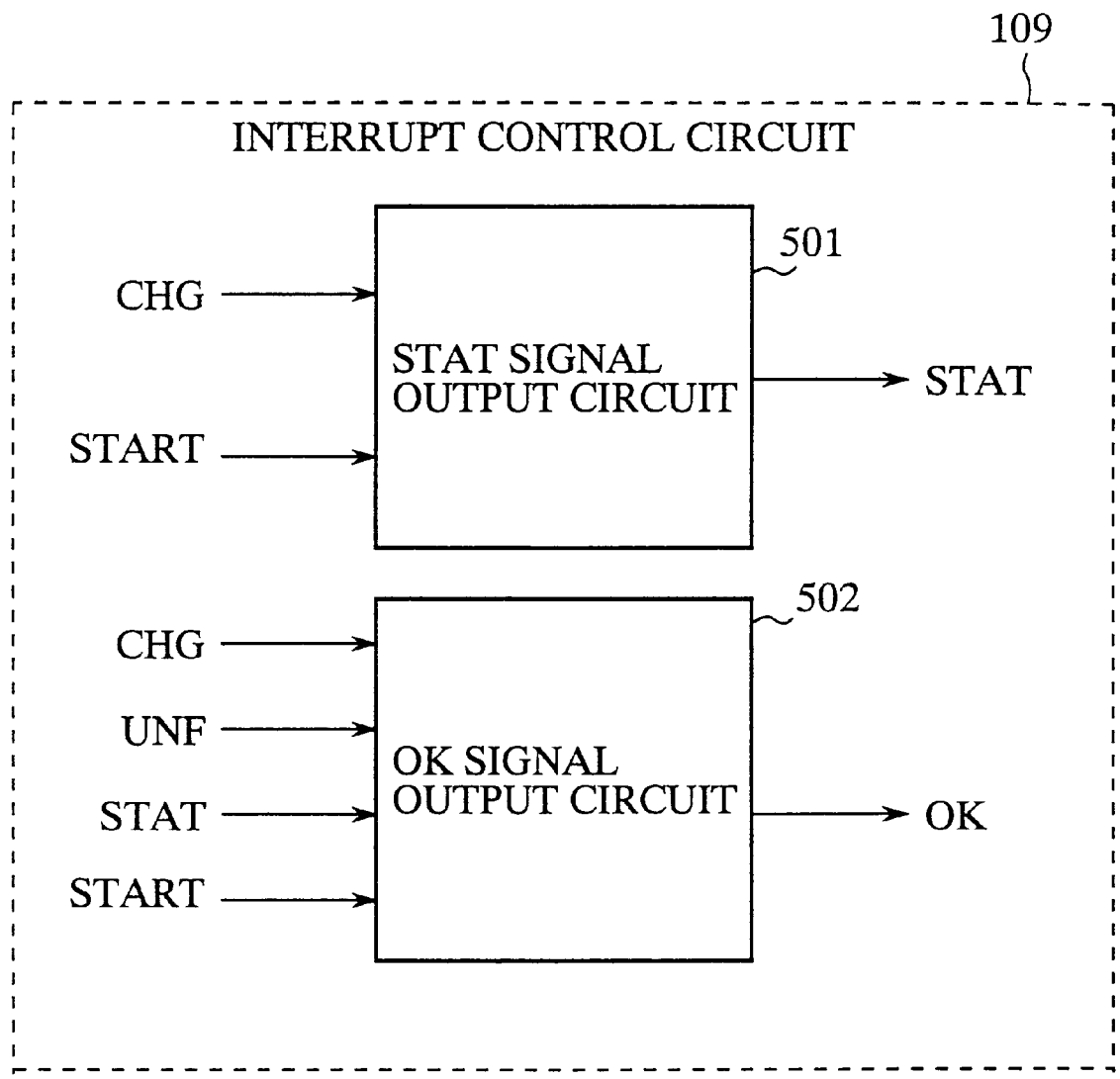
FIG. 5 is a block diagram showing the structure of an interrupt control circuit of the pulse width determining device according to the embodiment.

Referring next to FIG. 5, there is illustrated a block diagram showing the structure of the interrupt control circuit 109. In the figure, reference numeral 501 denotes a STAT signal output circuit for generating a timing signal STAT according to the switching signal CHG and the timing signal START applied thereto, and 502 denotes an OK signal output circuit for generating a timing signal OK according to the switching signal CHG, the underflow signal UNF, and the timing signals STAT and START applied thereto.

Figure 6:
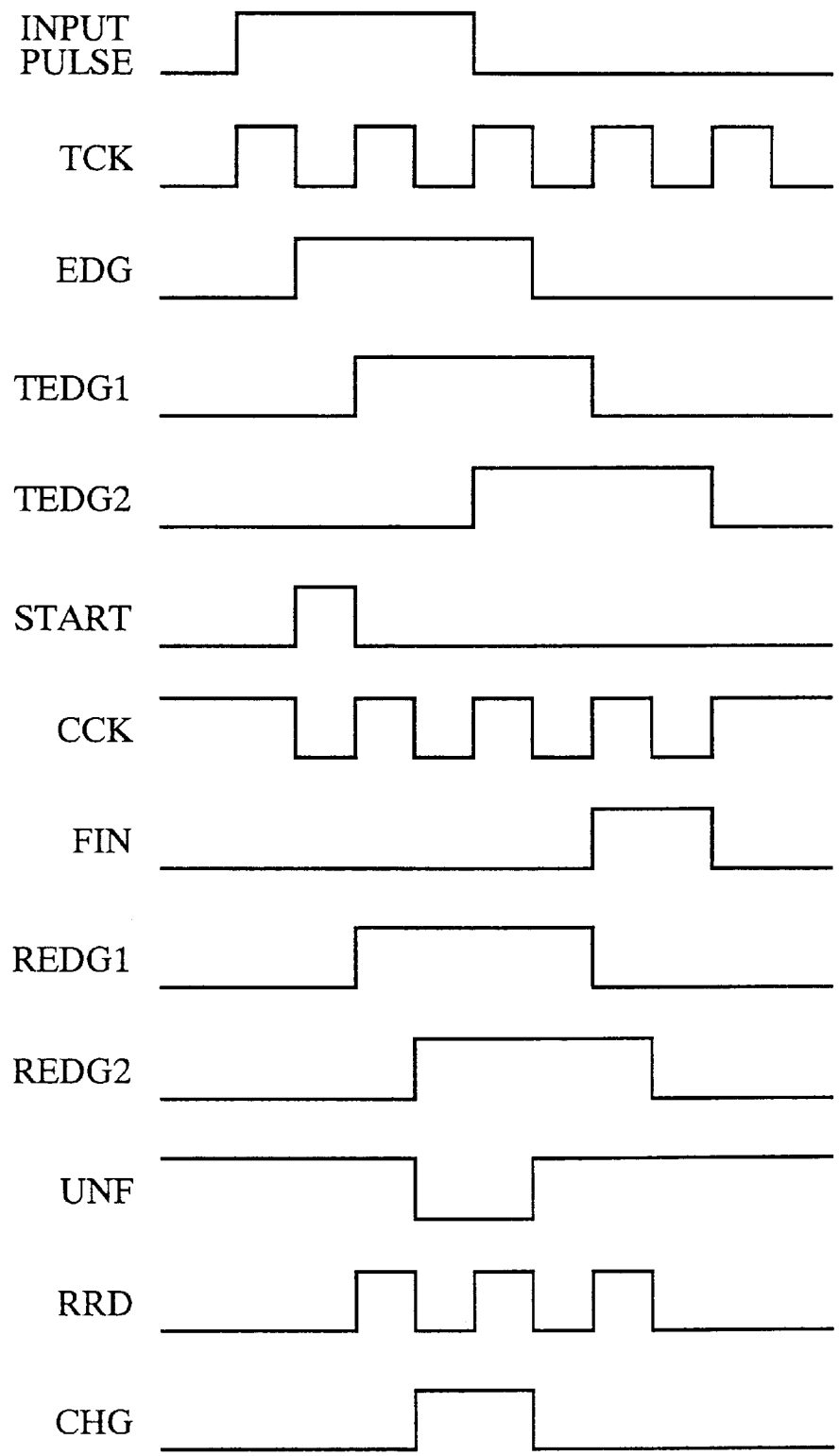
FIG. 6 is a timing chart showing the operations of an edge detecting circuit, the reload control circuit, the count clock control circuit, and the timing output circuit of the pulse width determining device according to the embodiment.

Referring next to FIG. 6, there is illustrated a timing chart showing the operations of the edge detecting circuit 101, the reload control circuit 102, the count clock control circuit 103, and the timing output circuit 104. Next, a description will be made as to the operation of the pulse width determining device of FIG. 1 with reference to FIG. 6.

The pulse width determining device is reset in response to the reset signal RST for resetting the whole of the pulse width determining device. After that, an asynchronous input signal, which is applied to the device after the device has been reset, is delivered to the edge detecting circuit 101. The edge detecting circuit 101 then makes the input pulse synchronous to the timer clock TCK and furnishes it as a pulse EDG.

When the timing output circuit 104 receives the pulse EDG from the edge detecting circuit, the delay circuit 403 thereof generates a pulse TEDG1 delayed by one-half of the pulse repetition period of the timer clock TCK with respect to the input pulse EDG and another pulse TEDG2 delayed by the pulse repetition period of the timer clock TCK with respect to the pulse TEDG1. When the START signal output circuit 401 receives both the pulse EDG and the first delayed pulse TEDG1, it generates and furnishes a timing signal START for triggering the pulse width determining operation. The timing signal START then triggers the count clock generating circuit 301 of the count clock control circuit 103 to generate and furnish a count clock CCK synchronous to the timer clock TCK. The timing signal START also triggers the interrupt control circuit 109 to start the pulse width determining operation. Furthermore, the FIN signal output circuit 402 of the timing output circuit 104 furnishes a pulse end signal FIN which makes a LOW to HIGH transition in synchronization with the falling edge of the first delayed pulse TEDG1 and makes a HIGH to LOW transition in synchronization with the falling edge of the second delayed pulse TEDG2.

On the other hand, the delay circuit 203 of the reload control circuit 102 generates a pulse REDG1 delayed by one-half of the pulse repetition period of the timer clock TCK with respect to the input pulse EDG and another pulse REDG2 delayed by the pulse repetition period of the timer clock TCK with respect to the input pulse EDG. The reload signal output circuit 202 accepts the delayed pulses REDG1 and REDG2 from the delay circuit and then generates a reload signal RRD which is asserted HIGH when only one of the delayed pulses REDG1 and REDG2 is at a HIGH level or when the underflow signal UNF is at a LOW level and the timer clock TCK is at a HIGH level. The reload signal RRD also makes a HIGH to LOW transition in synchronization with a falling edge of the underflow signal UNF. When the reload signal RRD makes a LOW to HIGH, the switch 107 is turned on. At that time, since the switching signal CHG is held at a LOW level after the device has been reset and the switch 106 therefore connects the first reload register 105a with the switch 107, the first initial count value stored in the first reload register 105a is reloaded into the down counter 108 by way of the switches 106 and 107. The down counter 108 then starts counting down from the first initial count value which corresponds to the minimum pulse width defined by the protocol. The down counter 108 decrements every time it receives each of active transitions of the count clock CCK from the count clock control circuit.

When the down counter 108, which started at the first initial value reloaded thereinto from the first reload register 105a, underflows, it furnishes an underflow signal UNF at a LOW level as shown in FIG. 6. In response to the underflow signal UNF asserted LOW, the reload control circuit 102 causes the reload signal RRD to make a HIGH to LOW transition. The switch 107 is then turned off. The reload control circuit 102 also causes the switching signal CHG to make a LOW to HIGH transition. As a result, the switch 106 is switched to connect the second reload register 105b with the second switch 107. FIG. 6 shows that the down counter 108 underflows when it receives only one count clock pulse CCK after it was reset, for simplicity. Actually, the down counter 108 is so constructed as to underflow after it has counted down a number of count clock pulses CCK from the count clock control circuit 103.

In that situation, when the timer clock TCK makes a LOW to HIGH transition, the reload signal RRD makes a LOW to HIGH transition again and the switch 107 is therefore turned on. The second initial count value stored in the second reload register 105b is then reloaded into the down counter 108. As previously explained, the second initial count value corresponds to the difference between the maximum pulse width and the minimum pulse width defined by the protocol governing serial communications. The down counter 108 then starts counting down from the second initial count value corresponding to the difference between the maximum pulse width and the minimum pulse width.

Figure 7:
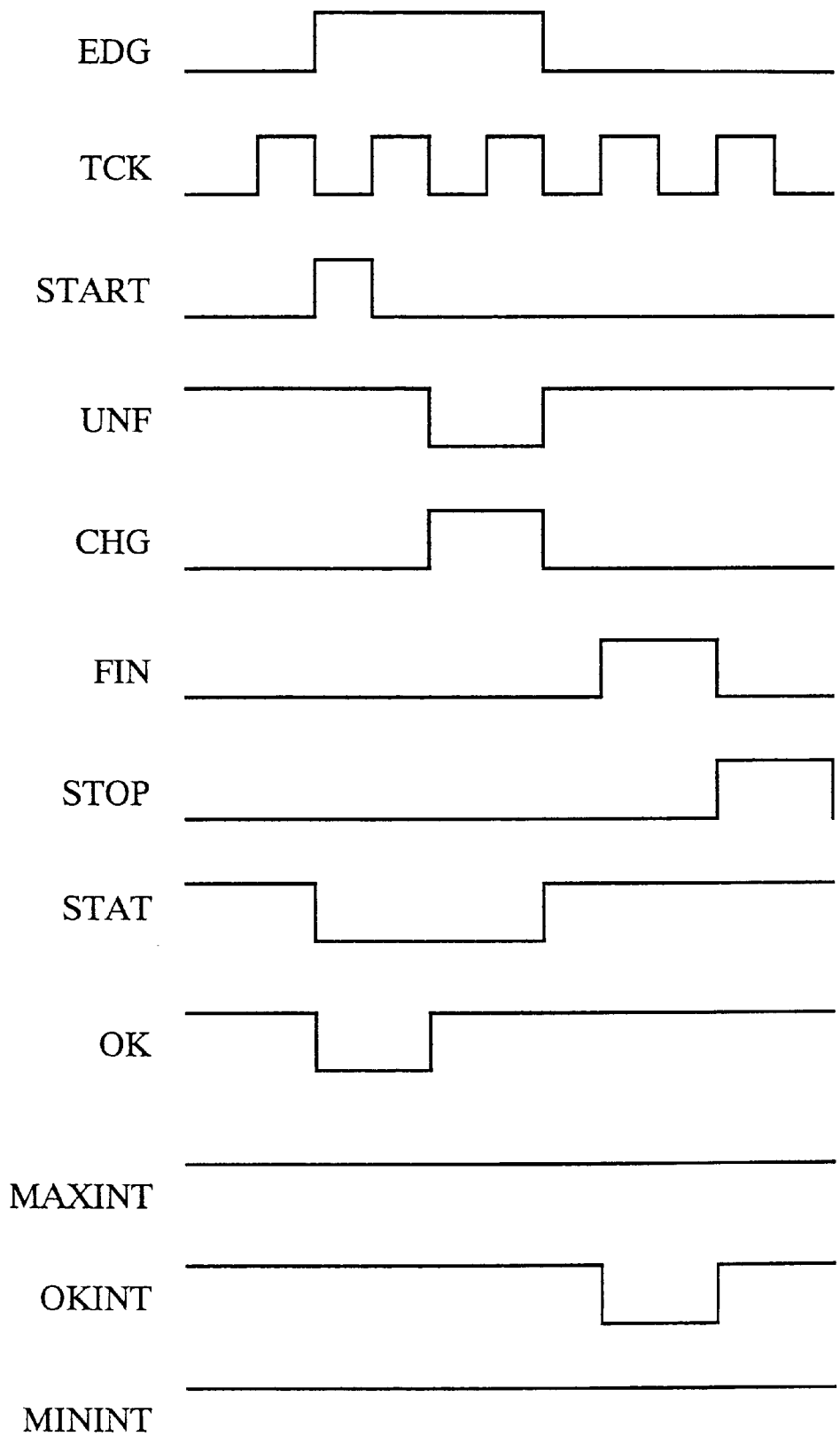
FIG. 7 is a timing chart showing the operations of the count clock control circuit, the interrupt control circuit, a MAXINT output circuit, an OKINT output circuit, and a MININT output circuit of the pulse width determining device according to the embodiment.

Referring next to FIG. 7, there is illustrated a timing chart showing the operations of the count clock control circuit 103, the interrupt control circuit 109, the MAXINT output circuit 110, the OKINT output circuit 111, and the MININT output circuit 112. Next, a description will be made as to the remainder of the pulse width determining operation with reference to FIG. 7.

When the pulse EDG makes a HIGH to LOW transition before the down counter 108, which started at the initial value reloaded thereinto from the second reload register 105b, underflows, the FIN signal output circuit 402 of the timing output circuit 104 furnishes a pulse end signal FIN to the STOP signal output circuit 302 of the count clock control circuit 103, the OKINT output circuit 111, and the MININT output circuit 112. FIG. 7 illustrates that the pulse EDG makes a HIGH to LOW transition on the rising edge of the underflow signal UNF. Actually, the pulse EDG makes a LOW to HIGH transition after the underflow signal UNF makes a HIGH to LOW transition.

From the pulse end signal FIN, the STOP signal output circuit 302 generates a timing signal STOP delayed by the pulse repetition period of the timer clock TCK with respect to the pulse end signal FIN, and furnishes it to the count clock generating circuit 301 of the count clock control circuit 103. The count clock generating circuit 301 then stops the generation of the count clock CCK in response to the timing signal STOP. As a result, the down counter 108 stops counting the count clock CCK.

On the other hand, the STAT signal output circuit 501 of the interrupt control circuit 109 generates and furnishes a timing signal STAT which is reset and makes a HIGH to LOW transition on the rising edge of the timing signal START, and makes a LOW to HIGH transition in synchronization with the falling edge of the switching signal CHG to the OK signal output circuit 502, the MAXINT output circuit 110, and the MININT output circuit 112. The OK signal output circuit 502 then generates and furnishes a timing signal OK which is reset and makes a HIGH to LOW transition on the rising edge of the timing signal START, and makes a LOW to HIGH transition on the rising edge of the switching signal CHG to the OKINT output circuit 111 and the MININT output circuit 112.

The MAXINT output circuit 110 furnishes an interrupt signal MAXINT at a LOW level when the down counter 108, which started at the second initial count value stored in the second reload register 105b, furnishes an underflow signal UNF after the timing signal STAT has made a LOW to HIGH transition. In other words, the MAXINT output circuit 110 furnishes an interrupt signal MAXINT indicating that the pulse width of the input pulse EDG is greater than the maximum pulse width defined by the protocol when the down counter 108, which started at the second initial count value which corresponds to the difference between the maximum and minimum pulse widths defined by the protocol, before the pulse EDG makes a HIGH to LOW transition. In the example as shown in FIG. 7, since the pulse EDG makes HIGH to LOW transition before the down counter 108 furnishes a second underflow signal UNF, the interrupt signal MAXINT is held at a HIGH level even though the timing signal STAT has made a LOW to HIGH transition.

The OKINT output circuit 111 furnishes an interrupt signal OKINT at a LOW level when both the timing signal OK and the pulse end signal FIN are at a HIGH level. In other words, the OKINT output circuit 111 furnishes an interrupt signal OKINT when the pulse EDG makes a HIGH to LOW transition before the down counter 108, which started at the second initial count value stored in the second reload register 105b after it had started at the first initial count value and already underflowed once, underflows again. The interrupt signal OKINT indicates that the device has determined that the pulse width of the input pulse EDG is in the predetermined range defined by the protocol governing serial communications, i.e., in the range from the minimum pulse width to the maximum pulse width. FIG. 7 shows such the case.

The MININT output circuit 112 furnishes an interrupt signal MININT which makes a HIGH to LOW transition when the pulse end signal FIN makes a LOW to HIGH transition while both the timing signals STAT and OK are at a LOW level. In other words, the MININT output circuit 112 generates an interrupt signal MINIT asserted LOW indicating that the pulse width is less than the minimum pulse width defined by the protocol when the pulse EDG makes a HIGH to LOW transition before the down counter 108, which started at the first initial count value stored in the first reload register 105a, underflows. In the example as shown in FIG. 7, since the down counter 108, which started at the first initial count value stored in the first reload register 105a, has underflowed before the pulse EDG makes a HIGH to LOW transition, and the switching signal CHG has made a LOW to HIGH transition, the interrupt signal MININT is held at a HIGH level.

Next, a description will be made in detail as to the following three cases: the first case wherein the pulse EDG makes a HIGH to LOW transition before the down counter 108, which started at the first initial count value stored in the first reload register 105a, generates a first underflow signal, and an interrupt signal MININT asserted LOW is therefore furnished; the second case wherein the down counter 108, which had started at the first initial count value stored in the first reload register 105a, generated a first underflow signal, the pulse EDG makes a HIGH to LOW transition before the down counter 108, which started at the second initial count value stored in the second reload register 105b, furnishes a second underflow signal, and an interrupt signal OKINT asserted LOW is therefore furnished; and the third case wherein the down counter 108, which started at the second initial count value stored in the second reload register 105b, generates a second underflow signal before the pulse EDG makes a HIGH to LOW transition, and an interrupt signal MAXINT asserted LOW is therefore furnished.

Figure 8:
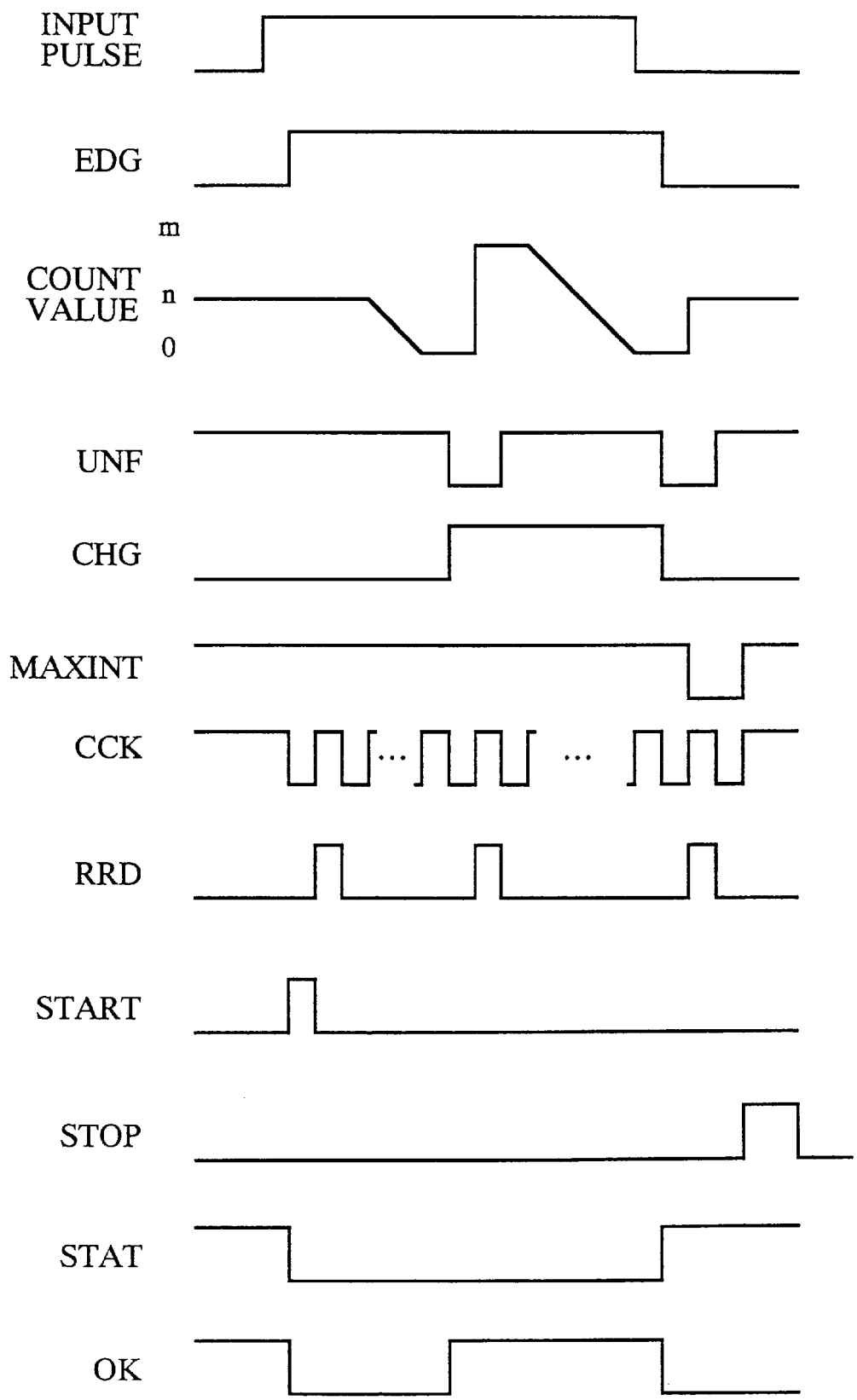
FIG. 8 is a timing chart of an example of the operation of the pulse width determining device in a case where an interrupt signal MAXINT is furnished.

Next, a description will be made as to the operation in the third case mentioned above where an interrupt signal MAXINT asserted LOW is furnished. Referring next to FIG. 8, there is illustrated a timing chart of an example of the operation of the pulse width determining device in the third case. In FIG. 8, the switching signal CHG is held at a LOW level first, as mentioned above, and the switch 106 therefore connects the first reload register 105a with the switch 107. The down counter 108 thus starts at the first initial count value n stored in the first reload register 105a. When the down counter 108 underflows and hence the underflow signal UNF from the counter makes a HIGH to LOW transition, the switching signal CHG makes a LOW to HIGH transition. As a result, the switch 106 changes the selection from the first reload register 105a to the second reload register 105b, and the second initial count value m stored in the second reload register 105b is reloaded into the down counter 108.

When the down counter 108, which started at the second initial count value m, underflows for the second time, the underflow signal UNF makes a HIGH to LOW transition again and then the switching signal CHG makes a HIGH to LOW transition. As a result, the timing signal STAT makes a LOW to HIGH transition and the timing signal OK makes a HIGH to LOW transition. The MAXINT output circuit then furnishes an interrupt signal MAXINT asserted LOW on a first rising edge of the timer clock TCK after the underflow signal UNF from the down counter has made a HIGH to LOW transition for the second time. After the generation of the interrupt signal MAXINT, the STOP signal output circuit 302 outputs a timing signal STOP. In response to the timing signal STOP, the count clock generating circuit 301 stops the generation of the count clock CCK. As a result, the down counter 108 stops counting the count clock CCK. Under actual receiving conditions in serial communications, the input signal and hence the pulse EDG should make a HIGH to LOW transition in a short time. While the reload signal RRD makes a LOW to HIGH transition in response to the transitions in those signals, the pulse width determining device does not perform any effective operations such as generating an interrupt signal.

Figure 9:
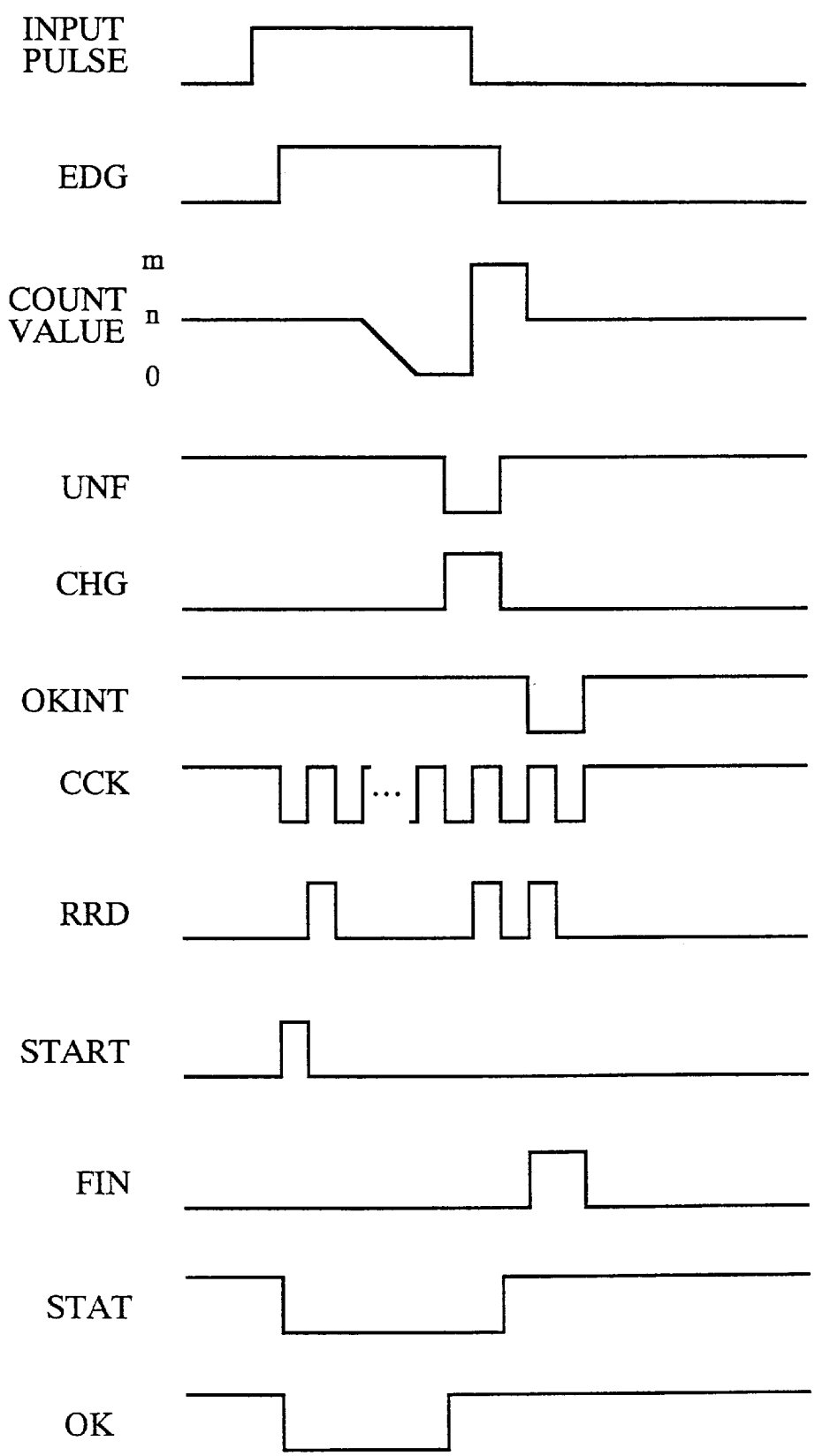
FIG. 9 is a timing chart of another example of the operation of the pulse width determining device in a case where an interrupt signal OKINT is furnished.
Figure 10:
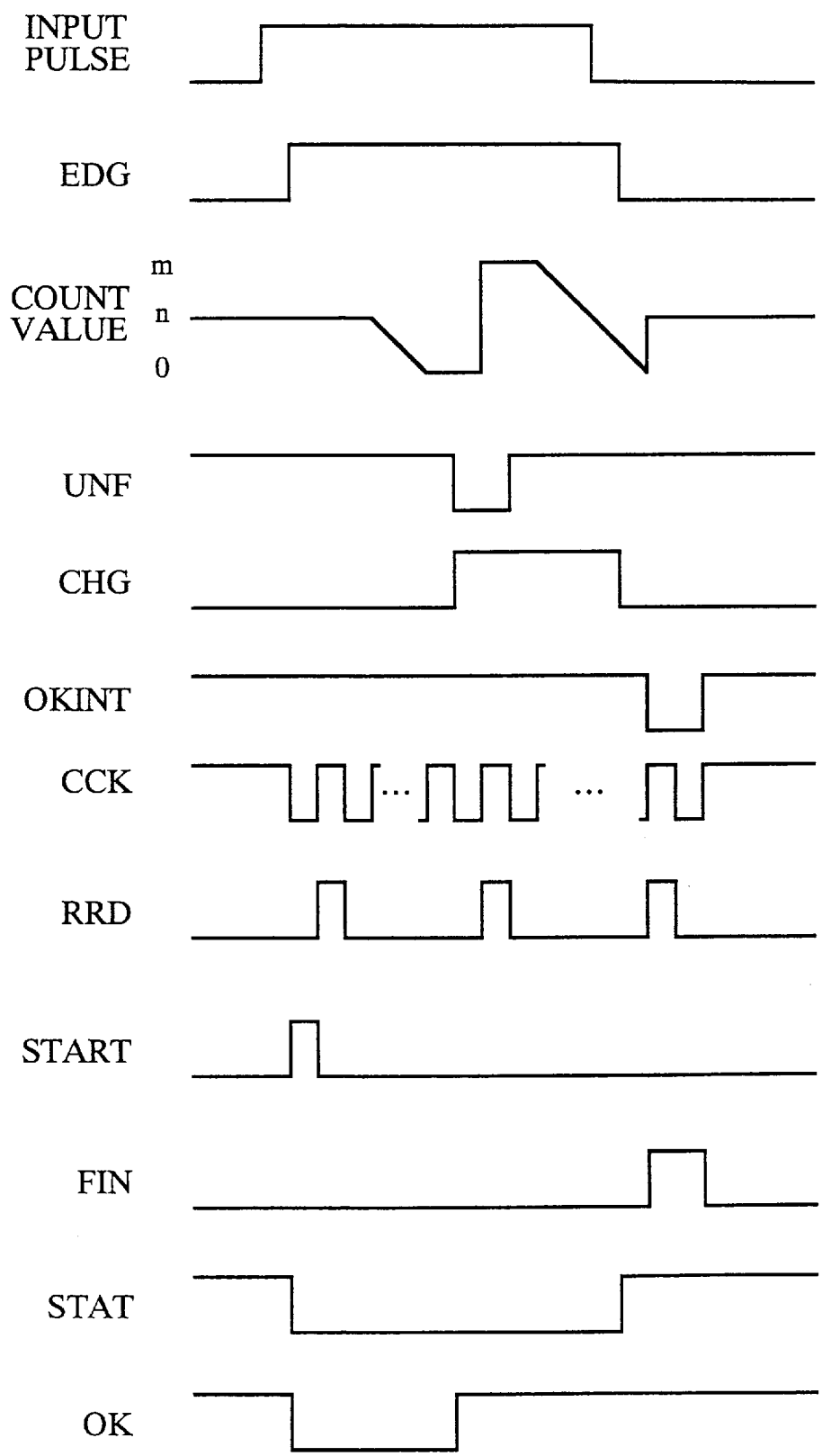
FIG. 10 is a timing chart of another example of the operation of the pulse width determining device in a case where an interrupt signal OKINT is furnished.

Next, a description will be made as to the operation in the second case mentioned above where an interrupt signal OKINT asserted LOW is furnished. Referring next to FIGS. 9 and 10, there are illustrated timing charts of examples of the operation of the pulse width determining device in the second case mentioned above. The difference between the operations in the third and second cases results from the situation in which the pulse EDG makes a HIGH to LOW transition before the down counter furnishes a second underflow signal UNF. FIG. 9 shows an example in which the pulse EDG makes a HIGH to LOW transition just after the first underflow signal UNF makes a HIGH to LOW transition, that is, when the device accepts an input pulse having the shortest pulse width which lies in the predetermined range of pulse widths, which will cause an interrupt signal OKINT asserted LOW. FIG. 10 shows another example in which the pulse EDG makes a HIGH to LOW transition just before the down counter 108 underflows for the second time, that is, when the device accepts a pulse having the longest pulse width which lies in the predetermined range, which will cause an interrupt signal OKINT asserted LOW.

In FIGS. 9 and 10, when the pulse EDG makes a HIGH to LOW transition, the switching signal CHG makes a HIGH to LOW transition as well. As a result, the timing signal STAT makes a LOW to HIGH transition. At that time, the underflow signal UNF is held at a HIGH level, and the timing signal OK is held at a HIGH level. The pulse end signal FIN then makes a LOW to HIGH transition. As a result, the OKINT signal output circuit generates an interrupt signal OKINT asserted LOW. After that, the count clock generating circuit stops the generation of the count clock CCK, and the down counter 108 then stops counting the count clock CCK.

Figure 11:
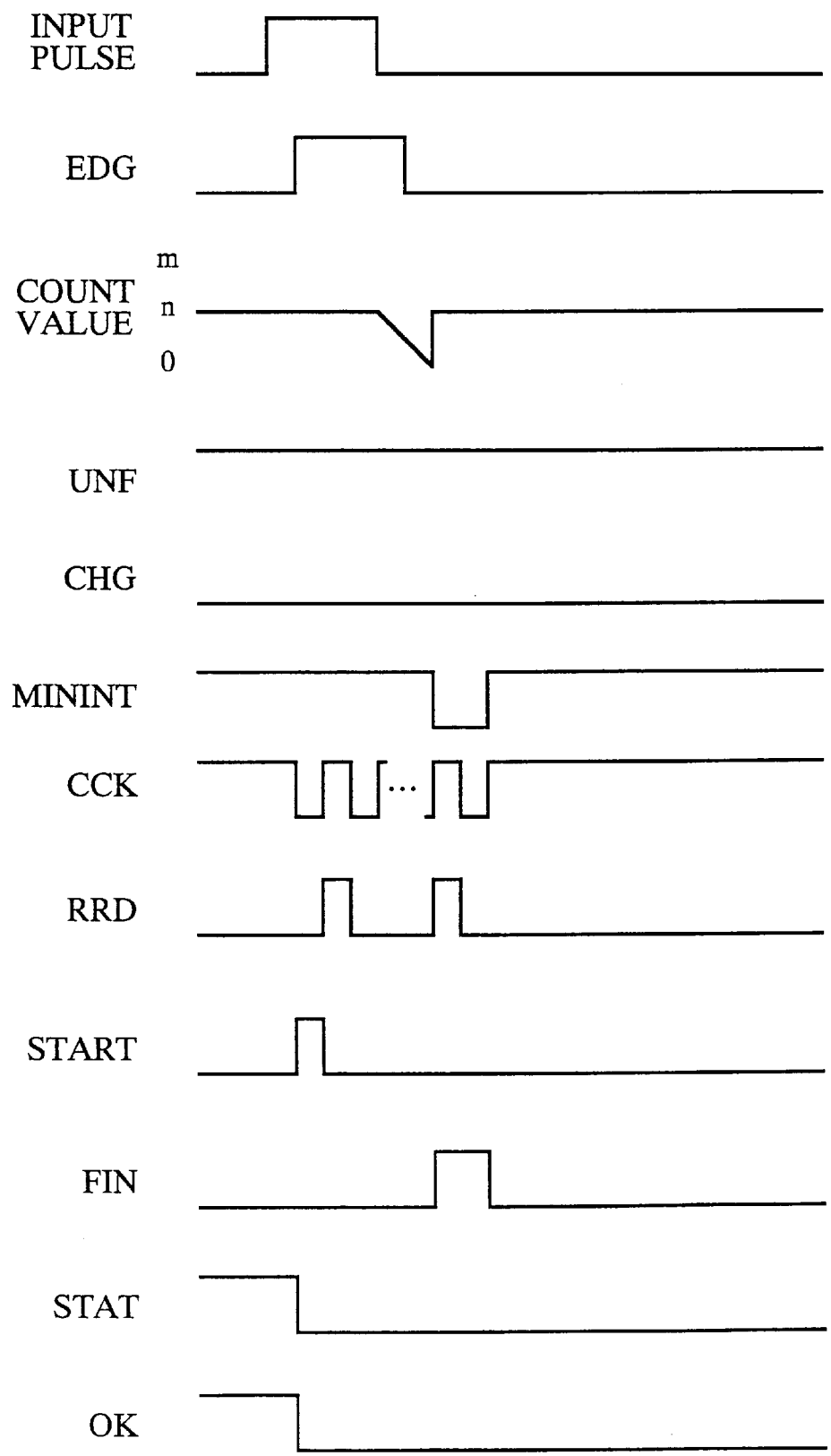
FIG. 11 is a timing chart of another example of the operation of the pulse width determining device in a case where an interrupt signal MININT is furnished.
Figure 12:
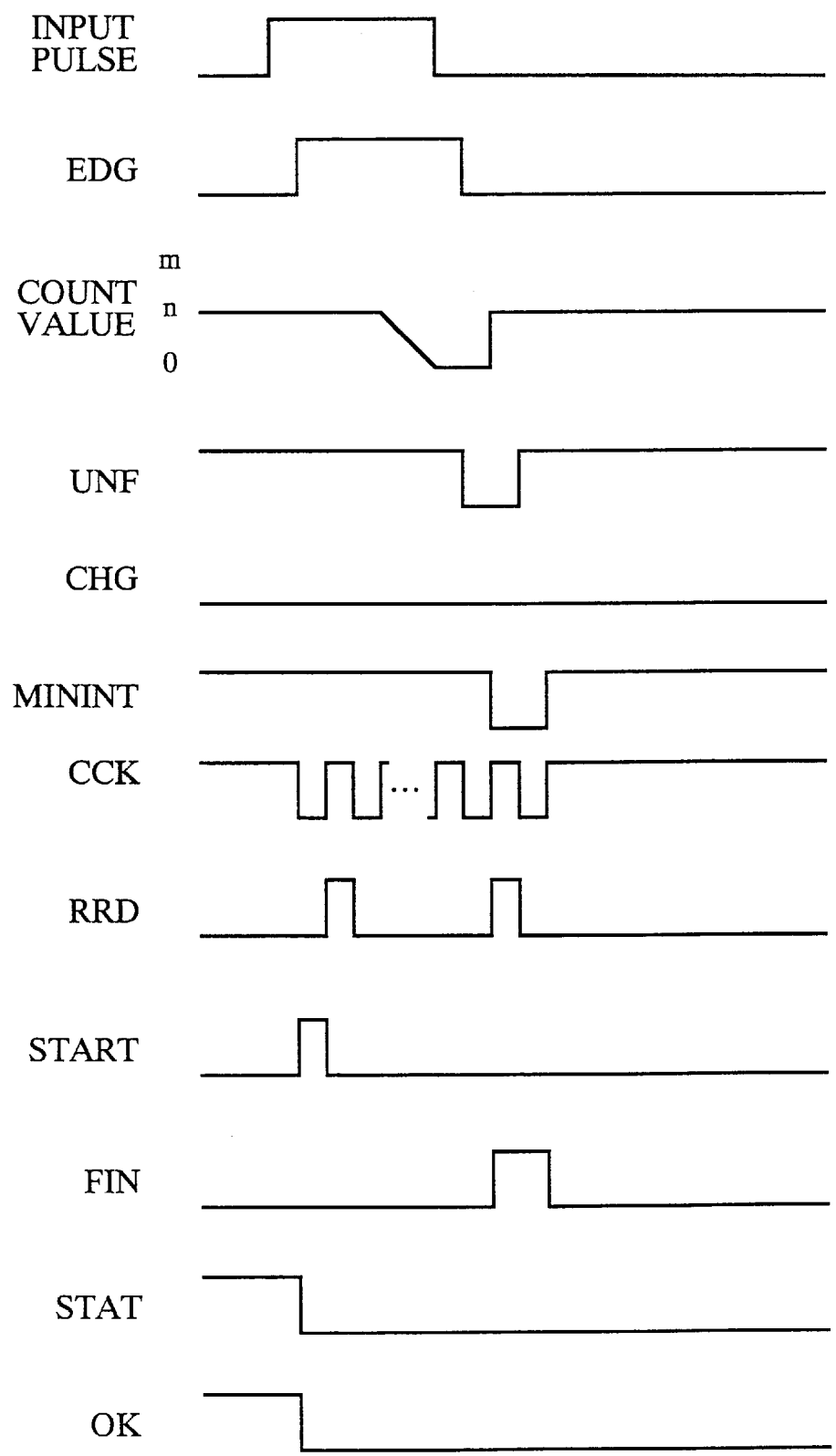
FIG. 12 is a timing chart of another example of the operation of the pulse width determining device in a case where an interrupt signal MININT is furnished.
Figure 13:
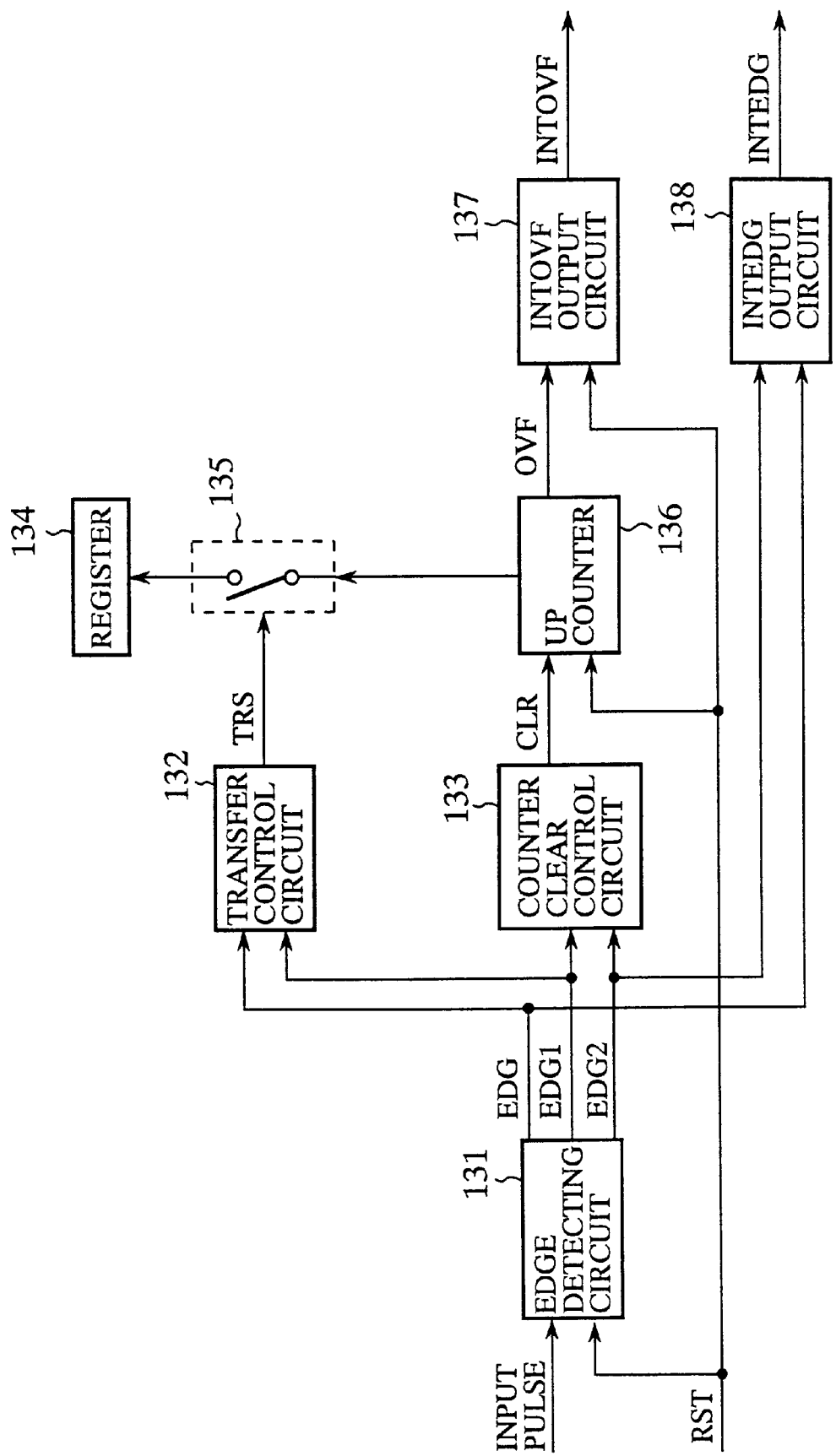
FIG. 13 is a block diagram showing the structure of a prior art pulse width determining device.
Figure 14:
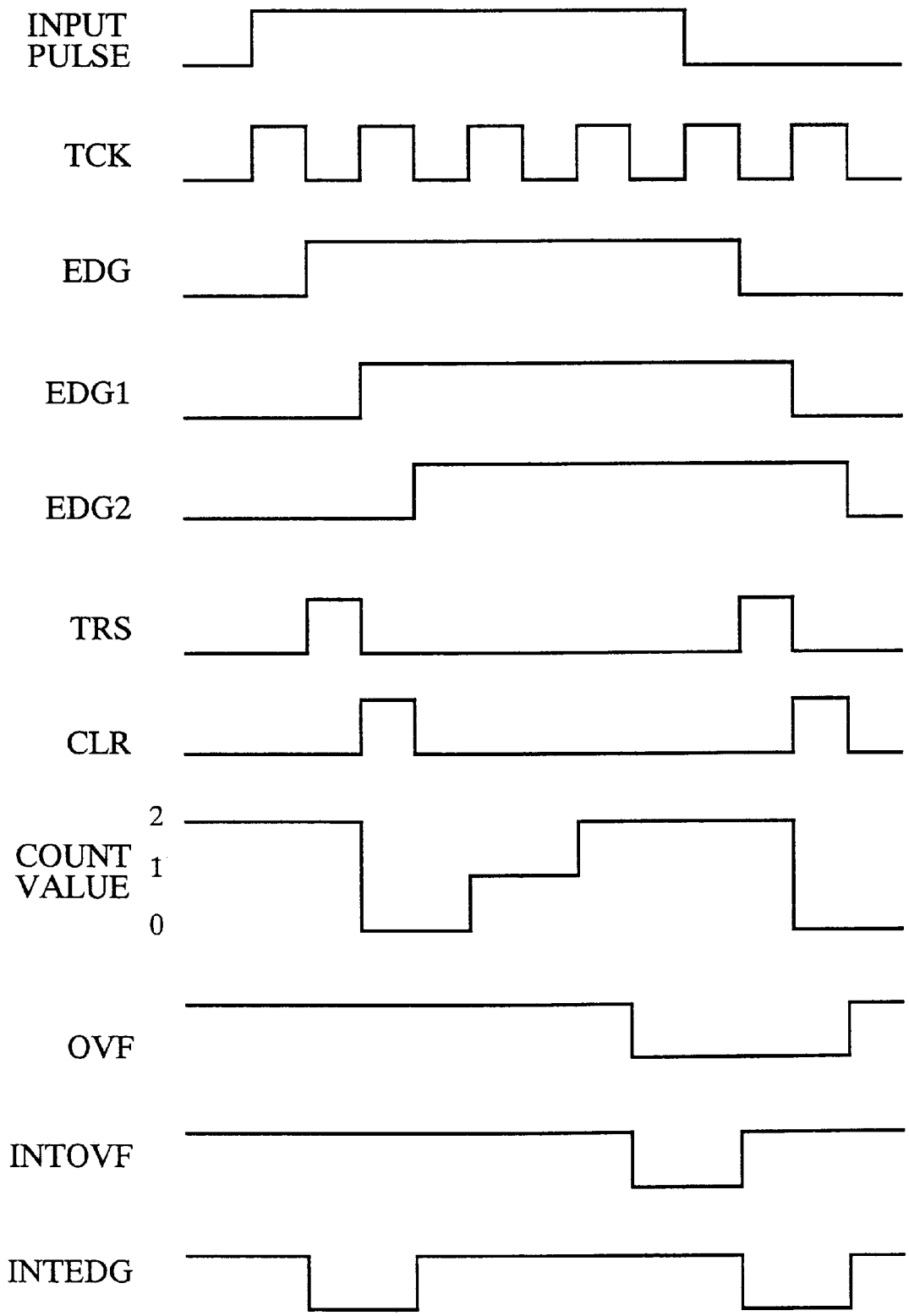
FIG. 14 is a timing chart showing the waveforms of signals from components of the prior art pulse width determining device of FIG. 13.

Next, a description will be made as to the operation in the first case mentioned above where an interrupt signal MININT asserted LOW is furnished. Referring next to FIGS. 11 and 12, there are illustrated timing charts of examples of the operation of the pulse width determining device in the first case mentioned above. The difference between the operations in the first through third cases results from the situation in which the pulse EDG makes a HIGH to LOW transition before the switching signal CHG makes a LOW to HIGH transition. FIG. 12 shows an example in which the pulse EDG makes a HIGH to LOW transition at the same time when the down counter, which started at the first initial count value n reloaded thereinto from the first reload register 105a, generates a first underflow signal UNF asserted LOW, and an interrupt signal MININT asserted LOW is then generated. FIG. 11 shows another example in which the pulse EDG makes a HIGH to LOW transition at an earlier time than the timing as shown in FIG. 12, and an interrupt signal OKINT asserted LOW is then generated.

In FIGS. 11 and 12, since the pulse EDG makes a HIGH to LOW transition while the down counter 108 is counting down from the first initial count value n stored in the first reload register 105a, most of the other signals remain in their initial states when the pulse EDG makes a HIGH to LOW transition. Thus the MININT output circuit 112 furnishes an interrupt signal MININT asserted LOW on the basis of the pulse end signal FIN applied thereto in that situation. As a result, the count clock generating circuit stops the generation of the count clock CCK, and therefore the down counter 108 stops counting the count clock CCK.

In the above description, it is assumed that the down counter 108 has a number of bits required to determine if the pulse width of each pulse applied to the pulse width determining device is in the predetermined range defined by the protocol governing serial communications. It is further assumed that the timer clock TCK has a repetition rate which is high enough to provide a resolution required to determine if the pulse width of each input pulse is in the predetermined range.

Numerous variants may be made in the exemplary embodiment mentioned above. It is apparent that the pulse width determining device of the embodiment can be so constructed as to furnish either only the interrupt signal OKINT or both the other interrupt signals MAXINT and MININT according to whether the down counter, which started counting down from both the first and second initial count values sequentially, underflows within a given period of time during which the count clock pulses are generated, instead of furnishing any one of MAXINT, OKINT, and MININT. It is also clear from the above description that the pulse width determining device of the embodiment can be so constructed as to set any one of flags to indicate that the pulse width of each input pulse is less than the minimum pulse width, is in the predetermined range of pulse widths, or is greater that the maximum pulse width, instead of furnishing any one of MAXINT, OKINT, and MININT. In serial communications, since the receiving circuit which accepts each input pulse generally includes a noise filter, it rarely receives a pulse having a pulse width that is less than the minimum pulse width defined by the protocol. Accordingly, the pulse width determining device can be so constructed as not to furnish the interrupt signal MININT.

It is also apparent that the delay circuits 203 and 403 can be formed as a single circuit. In a variant, each of the first and second reload registers 105a and 105b can be constructed of a plurality of 1-bit registers each for storing a 1-bit data so as to store a multi-bit data. In addition, each of the first and second switches 106 and 107 are so constructed as to change its selection between the first multi-bit initial data stored in the first reload register 105a and the second multi-bit initial data stored in the second reload register 105b. In this case, a down counter that can count down from the multi-bit initial data is used as the down counter 108.

Another variant embodiment according to the invention of a pulse width determining device includes a first down counter (not shown) which counts down from a first initial count value and a second down counter (not shown) which counts down from a second initial count. In that variant, the second down counter starts counting down at the same time when the first down counter starts counting down. In addition, the first initial count value can correspond to the minimum pulse width defined by the serial communications protocol, and the second initial count value can correspond to the maximum pulse width defined by the serial communications protocol.

As previously explained, the pulse width determining method and device according to the aforementioned embodiment of the present invention can speedily determine whether the pulse width of each input pulse lies in a predetermined range. The pulse width determining method and device are applicable to high-speed serial communications, for example.

Many widely different embodiments of the present invention may be constructed without departing from the spirit and scope of the present invention. It should be understood that the present invention is not limited to the specific embodiments described in the specification, except as defined in the appended claims.

What is claimed is:

1. A pulse width determining device for determining the pulse width of a pulse applied thereto, comprising:
   means for storing at least an initial count value corresponding to a predetermined pulse width;
   down counter means for counting down from said initial count value stored in said storing means until it underflows;
   control means for setting a period of time during which said down counter means can count down according to the pulse width of a pulse applied to the device; and
   means for determining whether or not the pulse width of the pulse is less than the predetermined pulse width according to a relation between timing with which said down counter means underflows and said time period set by said control means.

2. The device according to claim 1, wherein said storing means stores an initial count value corresponding to the shortest one in a predetermined range of pulse widths.

3. The device according to claim 1, wherein said storing means stores an initial count value corresponding to the longest one in a predetermined range of pulse widths.

4. The device according to claim 2, wherein said storing means further stores a second initial count value corresponding to either the longest one in said predetermined range of pulse widths or a difference between the longest pulse width and the shortest pulse width.

5. The device according to claim 4, wherein said determining means determines that the pulse width of the pulse is less than the shortest pulse width if said time period set by said control means is finished before said down counter means, which started counting down from the first initial count value, underflows, determines that the pulse width of the pulse lies in said predetermined range from the shortest pulse width to the largest pulse width if said down counter means, which started counting down from the first initial count value, has underflowed and said time period set by said control means is finished before said down counter means, which started counting down from the second initial count value, underflows again, and determines that the pulse width of the pulse is greater than the largest pulse width if said down counter means, which started counting down from said first and second initial count values sequentially or simultaneously, has underflowed twice before said time period set by said control means is finished.

6. A pulse width determining device for determining the pulse width of a pulse applied thereto, comprising:
   means for storing first and second initial count values;
   down counter means for counting down from said first initial count value stored in said storing until it underflows, and for starting counting down from said second initial count value stored in said storing means after said underflow occurs or at the same time when starting counting down from said first initial count value until said down counter means underflows again;
   control means for setting a period of time during which said down counter means can count down according to the pulse width of a pulse applied to said device; and
   means for determining whether or not the pulse width of the pulse is in a predetermined range from a first predetermined pulse width to a second predetermined pulse width according to a relation between timing with which said down counter means underflows and said time period set by said control means.

7. The device according to claim 6, wherein said determining means determines that the pulse width of the pulse lies in said predetermined range if said down counter means, which started counting down from the first initial count value, has underflowed and said time period set by said control means is finished before said down counter means, which started counting down from the second initial count value, underflows again.

8. The device according to claim 6, wherein said determining means determines that the pulse width of the pulse is less than said first predetermined pulse width if said time period set by said control means is finished before said down counter means, which started counting down from said first initial count value, underflows, and determines that the pulse width of the pulse is greater than the second predetermined pulse width if said down counter means, which started counting down from said first and second initial count values sequentially or simultaneously, has underflowed twice before said time period set by said control means is finished.

9. The device according to claim 6, wherein said down counter means is a single down counter and said device further comprises initial value setting means for setting said first initial value into said down counter first, and for setting said second initial value into said down counter after said down counter, which started counting down from said first initial count value, underflows, as needed, and wherein said first initial value corresponds to said first predetermined pulse width and said second initial value corresponds to a difference between said first and second predetermined pulse widths.

10. The device according to claim 9, wherein said storing means includes a first reload register for storing said first initial count value, and a second reload register for storing said second initial count value, and wherein said initial value setting means includes a switch for connecting said first reload register with said down counter first and for connecting said second reload register with said down counter after said down counter, which started counting down from said first initial count value, underflows.

11. A method of determining the pulse width of a pulse applied thereto, comprising the steps of:

storing at least one initial count value corresponding to a predetermined pulse width;

generating count clock pulses within a period of time having a length corresponding to the pulse width of an input pulse;

counting down the count clock pulses from said initial count value;

determining whether or not the pulse width of the input pulse is less than the predetermined pulse width according to a relation between timing with which an underflow occurs and said time period during which the count clock pulses are generated.

12. The method according to claim 11, wherein said initial count value corresponds to the shortest one in a predetermined range of pulse widths.

13. The method according to claim 11, wherein said initial count value corresponds to the longest one in a predetermined range of pulse widths.

14. The method according to claim 12, wherein in said storing step, a second initial count value is stored, said second initial count value corresponding to either the longest one in said predetermined range of pulse widths or a difference between the longest pulse width and the shortest pulse width.

15. The method according to claim 14, wherein in said down counting step, the count clock pulses are counted down from said first initial count value, and the count clock pulses are also counted down from said second initial count value, wherein the count down from said second initial count commences: i) after an underflow occurs with respect to the count down which starts from said first initial count value, or ii) at the same time when starting counting down from said first initial count, and wherein in said determining step: i) it is determined that the pulse width of the input pulse is less than the shortest pulse width if said time period during which the count clock pulses are generated is finished before an underflow occurs in said down counting step, ii) it is determined that the pulse width of the input pulse lies in said predetermined range from the shortest pulse width to the largest pulse width if an underflow has occurred starting from said first initial count value in said down counting step and said time period is finished before a further underflow occurs in said down counting step, and iii) it is determined that the pulse width of the input pulse is greater than the largest pulse width if two successive underflows have occurred in said down counting step before said time period is finished.

* * * * *